United States Patent [19]

Scarpa

[11] Patent Number: 5,563,916
[45] Date of Patent: Oct. 8, 1996

[54] APPARATUS AND METHOD FOR VARYING THE SLEW RATE OF A DIGITAL AUTOMATIC GAIN CONTROL CIRCUIT

[75] Inventor: Carl G. Scarpa, Edison, N.J.

[73] Assignee: Hitachi America, Ltd., Tarrytown, N.Y.

[21] Appl. No.: 461,417

[22] Filed: Jun. 5, 1995

[51] Int. Cl.$^6$ ................................................. H04L 27/08
[52] U.S. Cl. ........................................ 375/345; 455/234.1
[58] Field of Search ............................ 375/345; 330/128, 330/133, 279; 455/136, 138, 69, 234.1, 240.1, 245.1; 342/92

[56] References Cited

U.S. PATENT DOCUMENTS

| | | | |
|---|---|---|---|
| 3,983,381 | 9/1976 | Jones, Jr. | 235/154 |
| 4,075,573 | 2/1978 | Kennedy et al. | 330/129 |
| 4,191,995 | 3/1980 | Farrow | 364/113 |
| 4,674,105 | 6/1987 | Suzuki | 375/80 |
| 4,829,380 | 5/1989 | Iadipaolo | 358/166 |
| 4,829,593 | 5/1989 | Hara | 455/234 |
| 4,870,370 | 9/1989 | Hedberg et al. | 330/133 |
| 4,899,302 | 2/1990 | Nakayama | 364/729 |
| 4,989,074 | 1/1991 | Matsumoto | 358/21 R |
| 5,029,162 | 7/1991 | Epps | 370/77 |
| 5,036,527 | 7/1991 | Halim et al. | 375/98 |
| 5,050,192 | 9/1991 | Nawata | 375/98 |
| 5,081,653 | 1/1992 | Saito | 375/98 |
| 5,150,382 | 9/1992 | Kume | 375/88 |
| 5,208,835 | 5/1993 | Weeks et al. | 375/45 |
| 5,235,424 | 8/1993 | Wagner et al. | 358/174 |
| 5,301,364 | 4/1994 | Arens et al. | 455/69 |
| 5,379,075 | 1/1995 | Nagasawa et al. | 348/678 |
| 5,422,601 | 6/1995 | Kovacs et al. | 330/279 |

*Primary Examiner*—Stephen Chin
*Assistant Examiner*—Don Vo
*Attorney, Agent, or Firm*—John J. Sideris

[57] ABSTRACT

An apparatus and method for varying the slew rate of a digital AGC circuit is disclosed. A gain amplifier receiving an analog signal from a tuner is converted by an A/D converter into a digital form. An ABS circuit then obtains an absolute value level of the signal, which is then low pass filtered. The filtered signal is compared to a reference level to determine if the gain should be increased or decreased. The filtered signal is also communicated to a lock detect circuit to determine how far out of the desired range the signal is, thereby requiring large step changes for a fast, coarse adjustment or smaller step changes fine adjustment of the gain. An integrator combines the two results to determine the varying slew rate of the gain signal, which is converted back to the analog domain to control the amplifier.

18 Claims, 2 Drawing Sheets

APPARATUS AND METHOD FOR VARYING THE SLEW RATE OF A DIGITAL AUTOMATIC GAIN CONTROL CIRCUIT

FIELD OF THE INVENTION

The present invention relates in general to an automatic gain control apparatus and method, and more particularly to a digital, variable slew rate automatic gain control apparatus and method for setting the gain of a digital television receiver.

BACKGROUND OF THE INVENTION

Automatic gain control (AGC) apparatuses and methods have long been used in standard NTSC-type television receivers for maintaining the magnitude of tuned signals over variations in the modulated input signals. Variations occur due to the fact that transmission signals from stations operating at the same power level may not reach the receiver with the same power because of differences in transmission distances, carrier frequencies, atmospheric conditions, and obstructions between the transmitter and receiver.

Digital television receivers, which are susceptible to the same signal magnitude variations as the standard NTSC-type television receivers, need to maintain the received signal at a specific power level in order for proper processing to occur. Digital transmission signals, however, differ from standard analog transmission signals in that they appear to be a random sequence of pulses, resembling a random noise signal of varying amplitude. Some digital transmission signals, unlike analog transmission signals, lack a carrier signal that can be "locked" onto. Thus, it is difficult, if not impossible, to use standard AGC techniques effectively for a digital transmission signal. Moreover, the prior art automatic gain control circuits designed for digital transmission signals have been incapable of accurately demodulating the signal because their operation has been too varied.

Advanced digital television receivers are currently being designed to demodulate QAM, VSB, OFDM or QPSK encoded signals. In order to properly demodulate each of these encoding techniques, it is important to maintain the continuously varying signal levels at a particular power level. In addition, it is preferable that the AGC gain for modulated digital transmission signals be fast acting to increase accuracy and minimize the amount of time required to set the proper gain. Unfortunately, the current high gain AGC circuits tend to closely follow the pulsing data patterns contained in the received signal, causing the AGC circuit to fluctuate wildly.

Accordingly, what is needed is an AGC apparatus and method that can quickly adjust the gain while avoiding the problems caused by a fluctuating gain closely following the data patterns within the received signal.

It is, therefore, an object of the present invention to provide an AGC circuit having selectable slew rates for a quick signal lock-on and for accurate adjustment of the signal power without being effected by embedded data patterns in the received signal.

It is a further object of the present invention to provide a digital form variable slew rate AGC circuit having a first slew rate to provide a fast coarse adjustment of the signal power, and a second slew rate to provide a fine adjustment of the signal to the desired power.

It is still another object of the present invention to accomplish the above-stated objects by utilizing an apparatus which is simple in design and use, and economical to manufacture.

The foregoing objects and advantages of the invention are illustrative of those which can be achieved by the present invention and are not intended to be exhaustive or limiting of the possible advantages which can be realized. Thus, these and other objects and advantages of the invention will be apparent from the description herein or can be learned from practicing the invention, both as embodied herein or as modified in view of any variations which may be apparent to those skilled in the art. Accordingly, the present invention resides in the novel methods, arrangements, combinations and improvements herein shown and described.

SUMMARY OF THE INVENTION

In accordance with these and other objects of the invention, a brief summary of the present invention is presented. Some simplifications and omissions may be made in the following summary, which is intended to highlight and introduce some aspects of the present invention, but not to limit its scope. Detailed descriptions of a preferred exemplary embodiment adequate to allow those of ordinary skill in the art to make and use the inventive concepts will follow in later sections.

According to a broad aspect of the invention, an apparatus and method for varying the slew rate of a digital automatic gain circuit is disclosed. A digital automatic gain control apparatus is provided for varying the rate of signal change in a gain control signal. The digital automatic gain control apparatus includes an amplifier for amplifying a modulated analog signal in response to the gain control signal; an analog-to-digital converter for converting the analog output of the amplifier into a digital signal; a filter for filtering the digital signal to produce an average value of the signal power; a lock detect circuit for detecting when the average signal power is within a predetermined range; a comparator for comparing the average signal power to a reference value to determine whether the gain control signal should be increased or decreased; a step size select circuit responsive to the lock detect circuit for selecting the step size of the change to the gain control signal; an integrator for accumulating the output of the comparator in response to the signal level of step size select circuit, to generate the gain control signal; and a digital-to-analog converter converting the gain control signal generated by the integrator into an analog form to control the amplifier.

In a preferred embodiment of the present invention, an absolute valuing circuit is coupled to the input of the filter to provide an estimated power of the digital signal output by the analog-to-digital converter. The preferred embodiment further includes a sign detection circuit for providing a positive or negative signal indication of the output of the comparator to the step size select circuit.

Briefly, a process in accordance with the present invention includes the steps of amplifying a modulated analog signal in response to the gain control signal; converting the amplified analog signal into a digital signal; filtering the digital signal to produce an average value of the signal power; detecting when the average signal power is within a predetermined range; comparing the average signal power to a reference value to determine whether the gain control signal should be increased or decreased; selecting the size of change in the gain control signal in response to' the level of the detected average signal power; generating the gain control signal in response to the comparison of the average signal power to the reference value, and in response to the selected level of change in the gain control signal; and converting the gain control signal into an analog form to control the amplification of the modulated signal.

DETAILED DESCRIPTION OF A PREFERRED EMBODIMENT OF THE INVENTION

The present invention contemplates a variable slew rate automatic gain control (AGC) apparatus and method for providing a quick lock-on of a modulated digital signal using one slew rate, and for providing a fine signal adjust using another slew rate.

Figure 1:
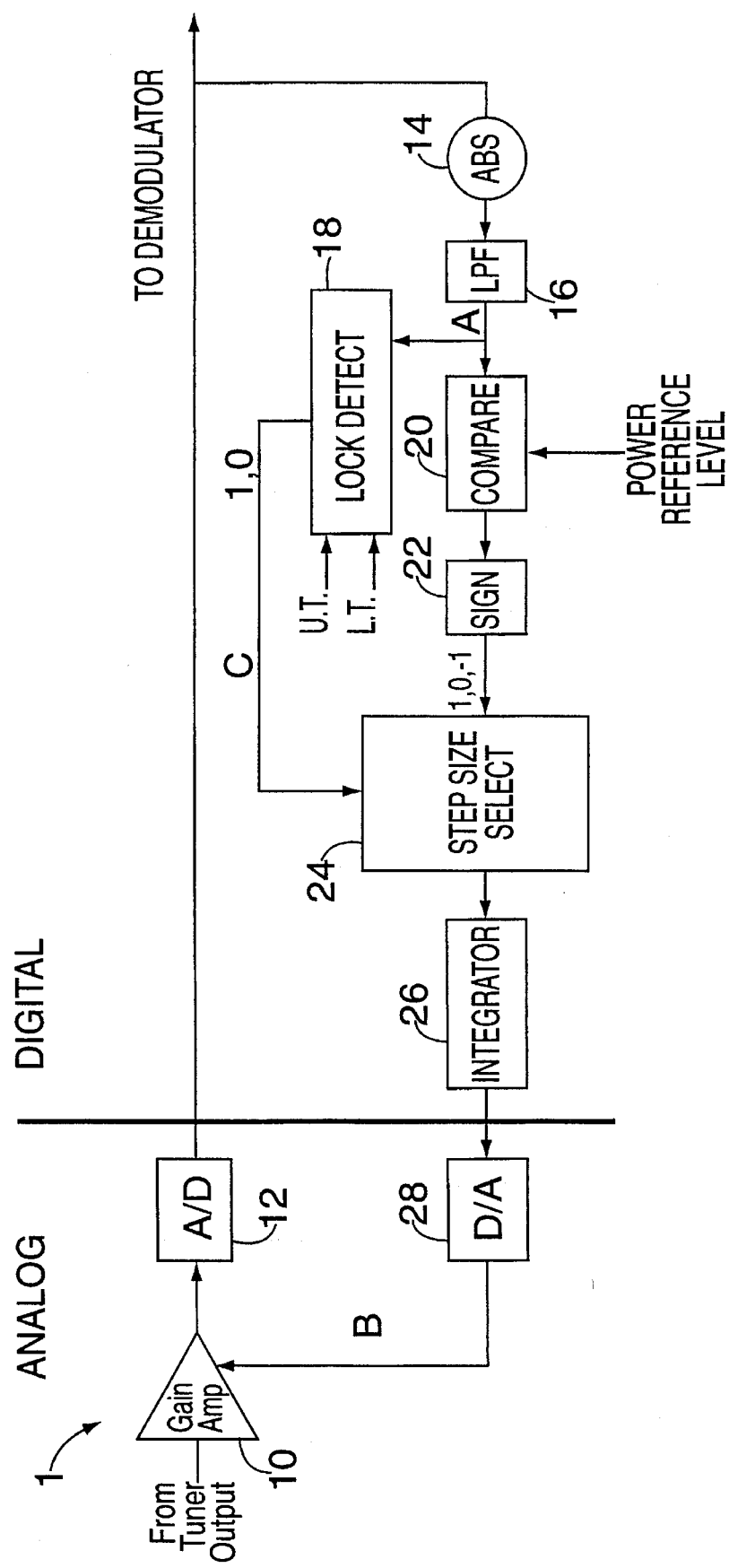
FIG. 1 is a block form diagram of a variable slew rate automatic gain control apparatus, according to the present invention.

Referring now to the drawings, there is disclosed in FIG. 1 broad aspects of the present invention. In FIG. 1, an AGC apparatus identified generally by reference numeral 1 is shown. The AGC apparatus 1 includes an analog amplifier 10 for amplifying a modulated signal from a tuner (not shown) in response to a gain control signal (described below), thereby producing an amplified multilevel signal. The amplifier 10, whose output is coupled to the input of an analog-to-digital (A/D) converter 12, amplifies the modulated signal to ensure that it comes within a predetermined dynamic range of the A/D converter 12.

The A/D converter 12 converts the analog form signal into a digital form using techniques common to those skilled in the art. The digital signal produced by the A/D converter 12 is communicated to a demodulator and to an absolute value (commonly referred to as "ABS") circuit 14. The demodulator, which provides processing, is not shown because it does not form part of the invention, and is provided only for ease in understanding how the present invention may be practiced. The ABS circuit 14 provides an absolute value of the signal power that is digitized by A/D converter 12. It should be noted that although the ABS circuit 14 is disclosed in a preferred embodiment of the invention, other non-linear circuits, such as those providing squaring or other non-linear operations on a digital signal may also be used without departing from the scope of the present invention.

The output of ABS circuit 14 is coupled to a low pass filter (LPF) 16 that removes high frequency components from the digitized signal to provide an estimated average value of the signal power. In turn, the output signal of the low pass filter 16 is coupled to the input of two separate comparing circuit components, a lock detect circuit 18 and a comparator 20. The lock detect circuit 18, which preferably comprises a pair of comparators, determines if the average signal power level is within a predetermined range defined by upper and lower threshold levels (illustrated as "UT" and "LT" respectively in FIG. 1). As explained in detail below, a signal value outside of the threshold ranges causes the AGC apparatus 1 to operate in a faster, coarse adjustment mode. Conversely, a signal value within the threshold ranges causes the AGC apparatus 1 to "lock" onto the digitized signal for providing a fine adjustment thereof.

The average signal power input to comparator 20 is used for comparison to a reference power level in order to determine whether AGC gain should be increased (+) or decreased (−). The positive or negative output of the comparator 20 is the input to an optional sign detector circuit 22, which buffers the comparator 20 output to adjust a step size select circuit 24. In a preferred embodiment of the present invention, the step size select circuit 24 switches the voltage level of the gain control signal under the direction of the lock detect circuit 18 between a large step size for a faster coarse adjustment and a small step size for a slower, fine adjustment. The step size select circuit 24 is preferably a bit shifter, shifting in one bit increments in response to the output of lock detect circuit 22. As can be understood by those skilled in the art, numerous alternatives such as a multiplier circuit or similar circuit for providing the function of selecting between different signal values may also be employed as a step select circuit 24, and still be within the scope of the present invention.

The output of the step size select circuit 24 is coupled to the input of an integrator circuit 26. The integrator circuit 26 controls the gain of the AGC apparatus 1, accumulating the sign difference between the digital signal power and the reference power level so as to either increase or decrease the gain control signal. The rate of increase or decrease in the gain (the slew) is dictated by the step size selected via the lock detect circuit 18. The accumulated difference between the actual and reference power levels is generated as the output of integrator 26, which is coupled to the digital input of a digital-to-analog (D/A) converter 28. The analog output of the D/A converter 28 is the gain control signal for analog amplifier 10. As can be understood by those skilled in the art, known sigma delta converters may also be used in the present invention instead of the D/A converter 28 to convert the digital output of integrator 26 to analog form, since the AGC control signal is typically low in frequency.

As can be understood, the AGC apparatus 1 contemplated by the present invention may be implemented programmatically or by direct electrical connection through customized integrated circuits, or a combination of both, using any of the methods known in the industry for providing the functions described above without departing from the teachings of the invention. Those skilled in the art will appreciate that from the disclosure of the invention provided herein, commercial semiconductor integrated circuit technology would suggest numerous alternatives for actual implementation of the functions of the AGC apparatus 1 that would still be within the scope of the invention.

In operation, the AGC apparatus 1 of the present invention receives from a tuner a modulated signal which may have undergone fading during transmission, at the analog amplifier 10. The incoming signal is amplified in accordance with the gain control signal received from the output of D/A converter 28, to bring the magnitude of the output signal within the input range of A/D converter 12. The A/D converter 12 produces a digital form of the amplified signal at its output. The digitized signal is communicated both as an input to a demodulator, and as feedback to the input of ABS circuit 14. The digitized signal used for AGC gain adjustment is subject to an absolute value operation which is then communicated to the input of the low-pass filter 16.

The low-pass filter 16 removes noise and high frequency components of the signal to produce an estimated average power signal, which is transmitted as the input of both the lock detect circuit 18 and the comparator 20. If the average power signal at the lock detect circuit 18 is above the upper threshold level, the signal is too large, for which the gain needs to be lowered. Similarly, if the average power signal is below the lower threshold level, the signal is too small and the gain needs to be increased.

In the situation where the average power signal lies outside of either the upper or lower threshold levels, the signal magnitude is quite far from the desired level, and the AGC apparatus 1 operates in a fast, coarse adjustment mode to bring the signal within the range defined by the threshold limits. In this mode, the lock detect circuit 18 signals the step size select circuit 24 to provide larger increments in the rate that integrator 26 adjusts the gain control signal. The larger step sizes allows a faster adjustment of the average power signal, to more quickly bring the signal with the upper and lower threshold range.

When the average power signal comes within the range defined by the upper and lower threshold levels, signal lock is achieved. Accordingly, lock detect circuit 18 signals the step size select circuit 24 to switch operation to a smaller step size mode, thereby allowing for fine tuning. In the smaller step size mode, fluctuating gain adjustments due to the data pattern of the digital signal is avoided.

At the comparator 20, if the measured power level of the signal is above the reference level, a negative voltage (−1) signal is output to the sign detection circuit 22. Conversely, if the measured power level of the signal is below the reference level, a positive (+1) signal is output. In a preferred embodiment of the invention, if the measured power and reference power levels are equal, a zero voltage signal is output. As can be appreciated by those skilled in the art, the present invention can be accomplished using only the positive (+1) and negative (−1) signals at the output of the comparator 20 instead of the three (−1, 0, +1) signals, and is not limited as such. Either method allows for decreasing the gain when the measured signal power is above the reference power level or increasing the gain when the measured signal power is below the reference level. The −1, 0 or +1 output signal of the comparator 20 is combined with the output of lock detect circuit 18 at the step size select circuit 24 to determine whether the gain as adjusted by the integrator 26 should be increased or decreased, and at a fast or slow slew rate.

Figure 2:
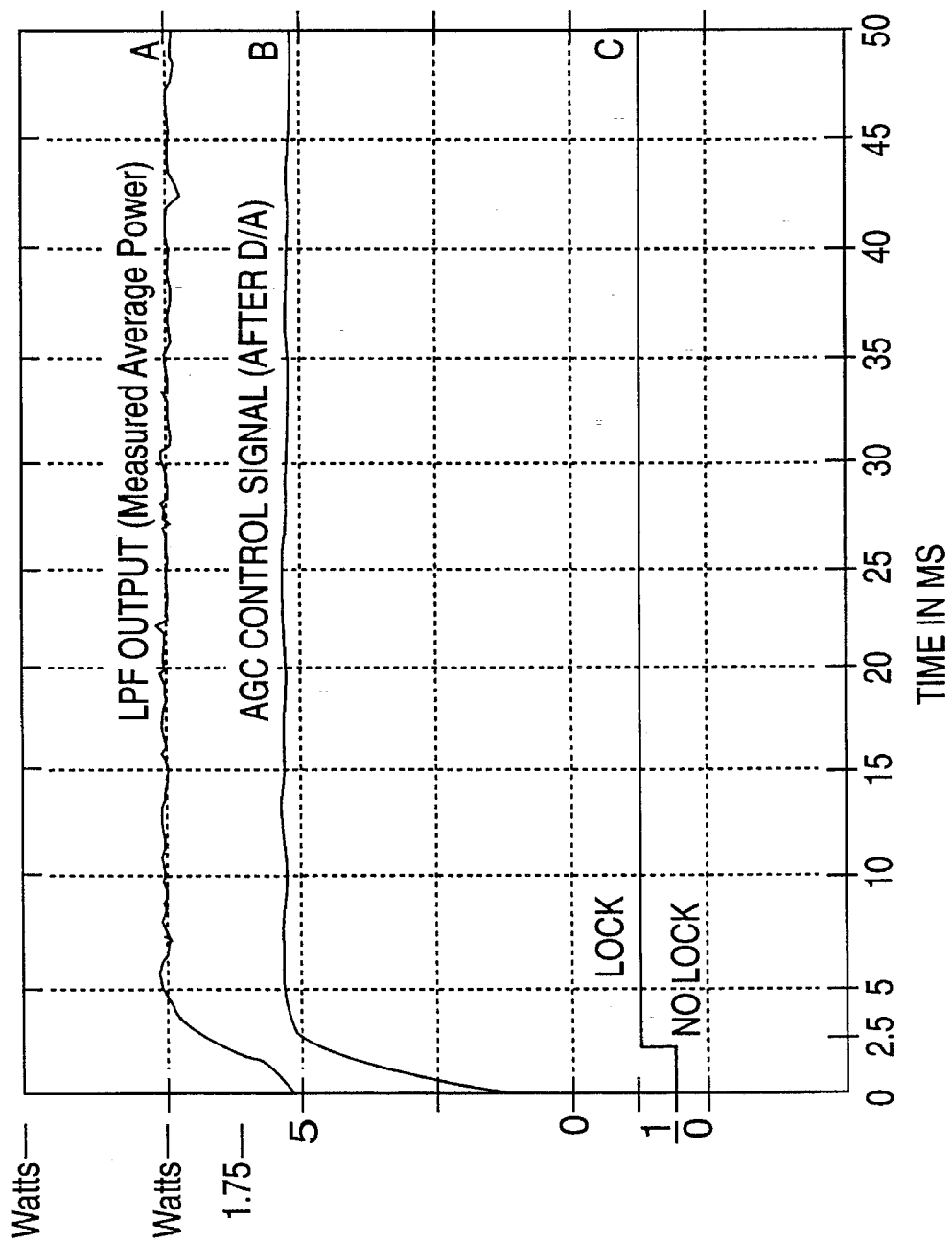
FIG. 2 is a graphical form diagram representative of exemplary circuit signals as a function of time, achieved in accordance with the present invention.

Reference will now be made to FIG. 1 in combination with FIG. 2. FIG. 2 is a plot of various signal levels within the AGC apparatus 1 as a function of time. As shown to the left side of the plot in FIG. 2, the gain control (signal B) has a fast slew rate during the initial, coarse adjustment, allowing for fast adjustments to the AGC. Here the gain is changed from 0.5 to 5.25 in about 2.5 milliseconds. Signal A, taken at the output of low pass filter 16, illustrates the changing rate of increase in measured average power. As can be seen, the rate at which the integrator 26 accumulates the difference between the measured average signal power (signal A) and the reference power will dictate the response time of the AGC apparatus 1. Large step sizes for the integrator 26 will allow for rapid changes in the AGC gain. In this faster mode, however, the gain is more sensitive to varying data patterns within the signal.

Advantageously, after the coarse adjustment is made to quickly increase the gain, the measured voltage is adjusted into the threshold ranges of lock detect circuit 18, causing signal lock-on (at about 2.5 milliseconds). The output of lock detect circuit 18 (signal C) switches to a high state, initiating the small step size mode in step size select circuit 24. Correspondingly, the slew rate changes (signal B), allowing for slow, accurate adjustment to the AGC gain. As illustrated, the slope of the increase in the measured average power decreases (signal A), in accordance with the slower slew rate The slower rate obviates the effects of changing data patterns in the measured power signal.

From the foregoing, it can be seen that the present invention overcomes the problems caused from rapid gain increases effected by embedded data patterns while avoiding the long time typically needed to set the signal level to the proper range for demodulation during acquisition. Furthermore, the AGC apparatus 1 of the present invention can be used in any digital communication system, independent of modulation format, where rapid AGC lock onto the received signal is important.

Although the present invention has been described in detail with particular reference to a preferred embodiment thereof, it should be understood that the invention is capable of other and different embodiments, and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only, and do not in any way limit the invention, which is defined only by the claims.

What is claimed:

1. A digital automatic gain control apparatus capable of varying the rate of signal change in a gain control signal, comprising:

an amplifier means for amplifying a modulated analog signal in response to the gain control signal;

an analog-to-digital converter means for converting the analog output of said amplifier means into a digital signal;

a filtering means for filtering the digital signal to produce an estimated average value of the signal power;

a first compare means for detecting when the average signal power is within a predetermined range;

a second compare means for comparing the average signal power to a reference value to determine whether the gain control signal should be increased or decreased;

a step size selecting means responsive to said first compare means for selecting from a plurality of step sizes the size of change in the gain control signal;

an integrator means for accumulating the digital output of said second compare means in combination with the change size selected by said step size selecting means, to generate a digital gain control signal at a rate corresponding to the selected size; and a digital to analog converter for converting the digital gain control signal generated by said integrator means into an analog form to control said amplifier means.

2. A digital automatic gain control apparatus according to claim 1 further comprising an absolute valuing means for providing to said filtering means an absolute value power signal of the digital signal output by said analog-to-digital converter means.

3. A digital automatic gain control apparatus according to claim 1 further comprising a sign detection means for providing a positive or negative signal indication of the output of said second compare means to said step size selecting means.

4. A digital automatic gain control apparatus according to claim 1 wherein said first compare means comprises a third compare means for comparing the filtered signal to a first threshold level signal, and a fourth compare means for comparing the filtered signal to a second threshold level signal.

5. A digital automatic gain control apparatus according to claim 1 wherein said step size selecting means is a multiplier.

6. A digital automatic gain control apparatus according to claim 1 wherein said step size selecting means is a bit shifter.

7. A method of varying the rate of signal change in a gain control signal of a digital automatic gain control apparatus, comprising the steps of:

amplifying a modulated analog signal in response to the gain control signal;

converting the amplified analog signal into a digital signal;

filtering the digital signal to produce an average value of the signal power;

detecting when the average signal power is within a predetermined range, comparing the average signal power to a reference value to determine whether the gain control signal should be increased or decreased;

selecting from a plurality of step sizes the size of change in the gain control signal in response to the level of the detected average signal power;

generating a digital gain control signal at a rate responsive to the comparison of the average signal power to the reference value in combination with the selected level of change in the gain control signal; and converting the digital gain control signal into an analog form to control the amplification of the modulated signal.

8. A method of varying the rate of signal change in a gain control signal of a digital automatic gain control apparatus according to claim 7 further comprising the step of performing an absolute value operation on the digitized signal to obtain an estimated signal power of the digital signal.

9. A method of varying the rate of signal change in a gain control signal of a digital automatic gain control apparatus according to claim 7 further comprising the step of detecting the positive or negative sign of the result of the comparison of the average signal power to the reference value, for determining if the gain control signal should be increased or decreased.

10. A method of varying the rate of signal change in a gain control signal of a digital automatic gain control apparatus according to claim 7 wherein the step of detecting when the average signal power is within a predetermined range further comprises the steps of comparing the filtered signal to a first threshold level signal, and comparing the filtered signal to a second threshold level signal, to determine if the filtered signal is within the first and second threshold levels.

11. A method of varying the rate of signal change in a gain control signal of a digital automatic gain control apparatus according to claim 7 wherein the step of selecting the change in the gain control signal further comprises multiplying the result of detecting when the average signal power is within a predetermined range with the result of the comparison of the average signal power with the reference value.

12. A method of varying the rate of signal change in a gain control signal of a digital automatic gain control apparatus according to claim 7 wherein the step of selecting the change in the gain control signal further comprises applying the result of detecting when the average signal power is within a predetermined range with the result of the comparison of the average signal power With the reference value to a bit shifter.

13. A digital automatic gain control circuit capable of adjusting the slew rate of signal change in a gain control signal, comprising:

an amplifier for amplifying a modulated analog signal in response to the gain control signal;

an analog-to-digital converter for converting the analog output of said amplifier into a digital signal;

a low pass filter for filtering the digital signal to generate an estimated average value of the signal power;

a first comparator for detecting when the average signal power is within a predetermined range;

a second comparator for comparing the average signal power to a reference power level to determine whether the gain control signal should be increased or decreased;

a step size selector responsive to said first comparator for selecting either a large or small amount of change in the gain control signal;

an integrator for combining the digital output of said second comparator with the change size selected by said step size selector, to generate the gain control signal at a rate corresponding to the selected size; and a digital to analog converter for converting the gain control signal generated by said integrator into an analog form to control said amplifier.

14. A digital automatic gain control circuit according to claim 13 further comprising an absolute valuing circuit for providing to said low pass filter an absolute value power signal of the digital signal output by said analog-to-digital converter.

15. A digital automatic gain control circuit according to claim 13 further comprising a sign detection circuit for providing a positive or negative signal indication of the output of said second comparator to said step size selector.

16. A digital automatic gain control circuit according to claim 13 wherein said first comparator comprises a third comparator for comparing the filtered signal to a first threshold level signal, and a fourth comparator for comparing the filtered signal to a second threshold level signal.

17. A digital automatic gain control circuit according to claim 13 wherein said step size selector is a multiplier.

18. A digital automatic gain control circuit according to claim 13 wherein said step size selector is a bit shifter.

* * * * *